(12) United States Patent
Bobek et al.

(10) Patent No.: US 11,584,994 B2
(45) Date of Patent: Feb. 21, 2023

(54) PEDESTAL FOR SUBSTRATE PROCESSING CHAMBERS

(71) Applicant: Applied Materials, Inc., Santa Clara, CA (US)

(72) Inventors: Sarah Michelle Bobek, Santa Clara, CA (US); Venkata Sharat Chandra Parimi, Sunnyvale, CA (US); Prashant Kumar Kulshreshtha, San Jose, CA (US); Vinay K. Prabhakar, Cupertino, CA (US); Kwangduk Douglas Lee, Redwood City, CA (US); Sungwon Ha, Palo Alto, CA (US); Jian Li, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 96 days.

(21) Appl. No.: 16/716,233

(22) Filed: Dec. 16, 2019

(65) Prior Publication Data
US 2020/0224310 A1    Jul. 16, 2020

Related U.S. Application Data

(60) Provisional application No. 62/792,746, filed on Jan. 15, 2019.

(51) Int. Cl.
*C23C 16/458*    (2006.01)
*C23C 16/46*    (2006.01)

(52) U.S. Cl.
CPC ...... *C23C 16/4586* (2013.01); *C23C 16/4585* (2013.01); *C23C 16/46* (2013.01)

(58) Field of Classification Search
CPC ............ C23C 16/4586; C23C 16/4585; C23C 16/4581; H01J 37/32642
See application file for complete search history.

(56) References Cited

U.S. PATENT DOCUMENTS

| 5,897,752 A | 4/1999 | Hong et al. |
| 6,189,482 B1 | 2/2001 | Zhao et al. |

(Continued)

FOREIGN PATENT DOCUMENTS

| EP | 1167571 A2 | 1/2002 |
| JP | 2004327761 A | 11/2004 |

(Continued)

OTHER PUBLICATIONS

Chinese Office Action dated Jul. 6, 2020 for Application No. 202020083218.9.

(Continued)

*Primary Examiner* — Keath T Chen
(74) *Attorney, Agent, or Firm* — Patterson & Sheridan, LLP; Keith Taboada

(57) ABSTRACT

Aspects of the present disclosure relate generally to pedestals, components thereof, and methods of using the same for substrate processing chambers. In one implementation, a pedestal for disposition in a substrate processing chamber includes a body. The body includes a support surface. The body also includes a stepped surface that protrudes upwards from the support surface. The stepped surface is disposed about the support surface to surround the support surface. The stepped surface defines an edge ring such that the edge ring is integrated with the pedestal to form the body that is monolithic. The pedestal also includes an electrode disposed in the body, and one or more heaters disposed in the body.

21 Claims, 3 Drawing Sheets

(56) References Cited

U.S. PATENT DOCUMENTS

| | | | |
|---|---|---|---|
| 6,721,162 B2 * | 4/2004 | Weldon | C23C 16/4586 279/128 |
| 7,024,105 B2 * | 4/2006 | Fodor | C23C 16/4585 118/50.1 |
| 8,274,017 B2 | 9/2012 | Yap et al. | |
| 2002/0059981 A1 * | 5/2002 | Hao | H01J 37/32642 156/345.47 |
| 2002/0137334 A1 | 9/2002 | Watanabe et al. | |
| 2003/0071260 A1 * | 4/2003 | Ootsuka | H01J 37/32559 257/44 |
| 2003/0180459 A1 * | 9/2003 | Redeker | H01L 21/6831 427/248.1 |
| 2004/0112544 A1 * | 6/2004 | Yan | H01L 21/67069 156/345.51 |
| 2007/0266945 A1 | 11/2007 | Shuto et al. | |
| 2008/0041312 A1 * | 2/2008 | Matsuyama | C23C 16/4586 118/728 |
| 2008/0179288 A1 | 7/2008 | Collins et al. | |
| 2010/0071850 A1 * | 3/2010 | Himori | H01L 21/6833 156/345.44 |
| 2010/0243606 A1 * | 9/2010 | Koshimizu | H01J 37/32091 216/67 |
| 2011/0126984 A1 * | 6/2011 | Kang | H01J 37/32642 156/345.51 |
| 2014/0251542 A1 | 9/2014 | Parsey, Jr. et al. | |
| 2016/0068959 A1 | 3/2016 | Lau et al. | |
| 2017/0040198 A1 | 2/2017 | Lin et al. | |
| 2017/0162417 A1 | 6/2017 | Ye et al. | |
| 2017/0250099 A1 | 8/2017 | Balon | |
| 2017/0353994 A1 | 12/2017 | Kim et al. | |
| 2017/0358431 A1 * | 12/2017 | Dorf | H01J 37/32146 |

FOREIGN PATENT DOCUMENTS

| | | |
|---|---|---|
| JP | 2006319093 A | 11/2006 |
| JP | 3972710 B2 | 9/2007 |
| JP | 2014013874 A | 1/2014 |
| KR | 20170003792 A | 1/2017 |

OTHER PUBLICATIONS

International Search Report and Written Opinion dated Apr. 10, 2020 for Application No. PCT/US2019/060314.
U.S. Appl. No. 16/677,491, filed Nov. 7, 2019.
U.S. Appl. No. 16/672,294, filed Nov. 1, 2019.
U.S. Appl. No. 16/703,140, filed Dec. 4, 2019.
Taiwan Office Action dated Oct. 23, 2020 for Application No. 108144046.
International Search Report and Written Opinion dated Apr. 14, 2020 for Application No. PCT/US2019/066551.
Taiwan Office Action dated May 31, 2021 for Application No. 108144046.

\* cited by examiner

PEDESTAL FOR SUBSTRATE PROCESSING CHAMBERS

CROSS-REFERENCE TO RELATED APPLICATIONS

This application claims benefit of U.S. provisional patent application Ser. No. 62/792,746, filed Jan. 15, 2019, which is herein incorporated by reference.

BACKGROUND

Field

Aspects of the present disclosure relate generally to pedestals, components thereof, and methods of using the same for substrate processing chambers.

Description of the Related Art

Pedestals are used in substrate processing chambers for processing substrates that are used in semiconductor applications. A processing method such as plasma-enhanced chemical vapor deposition (PECVD) can be used in such substrate processing chambers. However, many pedestal designs suffer from arcing, or capacitive discharge, between a substrate and other components within the substrate processing chamber during substrate processing. For example, arcing can occur between the substrate and an edge ring that is placed adjacent to the substrate. Arcing can lead to several operational problems, such as less film deposition on the substrate, a loss of film deposition near the edge of the substrate (leading to non-uniformity in the film deposition's profile), chipping of the edge ring, or a fusing of the edge ring to the substrate. Attempts have been made to solve these problems, but have incurred issues such as reduced throughput, lower die-per-substrate efficiency, insufficient film deposition, or high operational costs.

Therefore, there is a need for an improved pedestal for substrate processing chambers.

SUMMARY

Implementations of the present disclosure generally relate to pedestals for substrate processing chambers.

In one implementation, a pedestal for disposition in a substrate processing chamber includes a body. The body includes a support surface. The body also includes a stepped surface that protrudes upwards from the support surface. The stepped surface is disposed about the support surface to surround the support surface. The stepped surface defines an edge ring such that the edge ring is integrated with the pedestal to form the body that is monolithic. The pedestal also includes an electrode disposed in the body, and one or more heaters disposed in the body.

In one implementation, a pedestal for disposition in a substrate processing chamber includes a body having a support surface. The pedestal includes a first electrode disposed in the body at a first depth below the support surface. The pedestal includes a coating coated on at least part of the first electrode. The coating has a volumetric electrical resistivity that is greater than a volumetric electrical resistivity of the first electrode.

In one implementation, a substrate processing chamber includes a chamber body having an internal volume, and a pedestal disposed in the internal volume. The pedestal includes a support surface. The substrate processing chamber also includes an edge ring. The edge ring includes an inner surface, an outer surface, an upper surface, and a bevel on an upper end of the inner surface. The bevel extends between the inner surface and the upper surface.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only common implementations of this disclosure and are therefore not to be considered limiting of its scope, for the disclosure may admit to other equally effective implementations.

Figure 1:
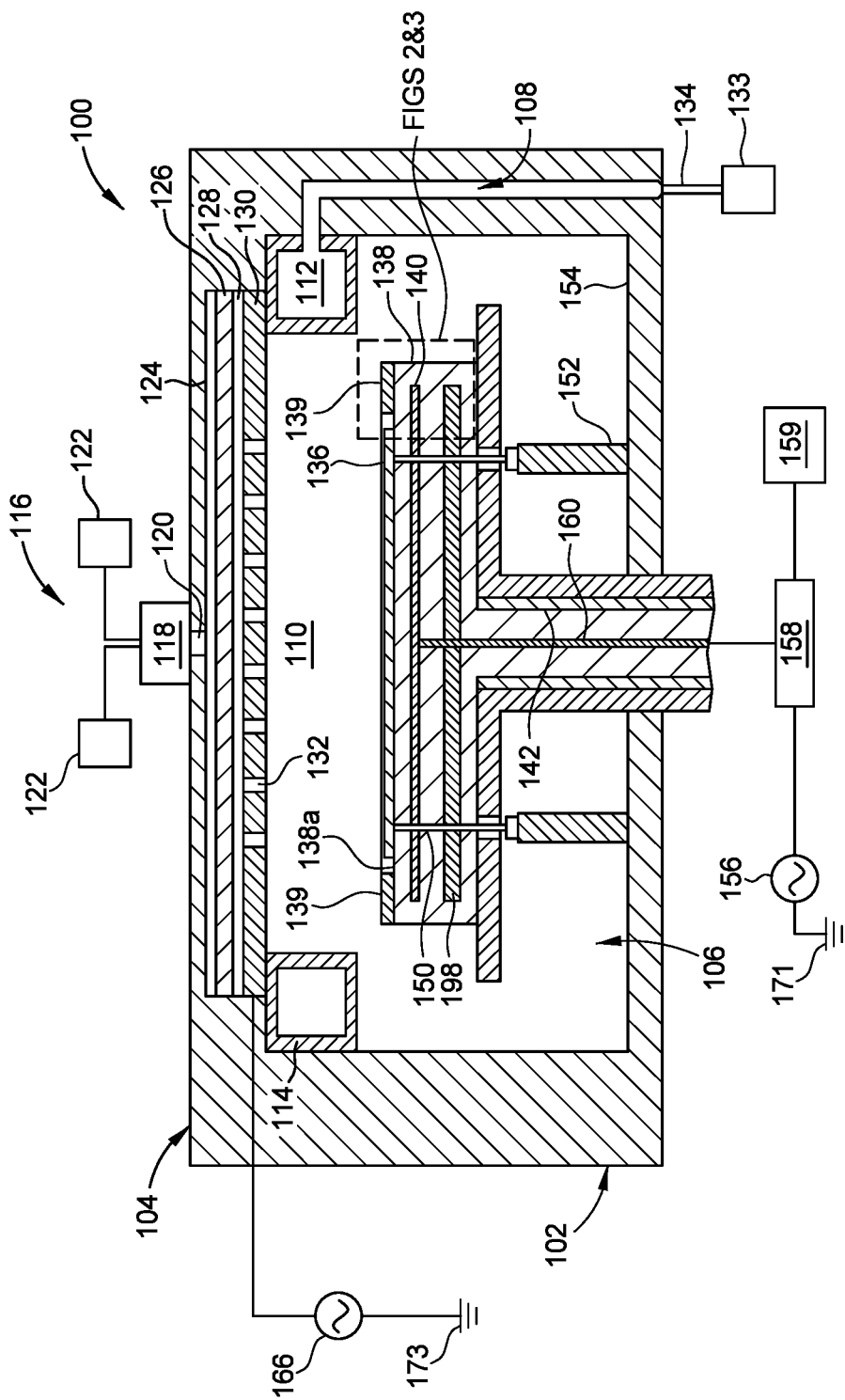
FIG. 1 is a schematic cross-sectional view of a chamber with a pedestal disposed therein, according to one implementation.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Aspects of the present disclosure relate to pedestals for substrate processing chambers. FIG. 1 is a schematic cross-sectional view of a chamber 100 with a pedestal 138 disposed therein, according to one implementation. The chamber 100 is for example a substrate processing chamber for fabricating semiconductors. The chamber 100 may be a deposition chamber such as a vapor deposition chamber, for example a chemical vapor deposition (CVD) chamber or a plasma enhanced CVD (PECVD) chamber. The chamber 100 has a chamber body 102 and a chamber lid 104. The chamber body 102 includes an internal volume 106 therein and a pumping path 108. The internal volume 106 is the space defined at least partially by the chamber body 102 and the chamber lid 104. The pumping path 108 is a path formed in the chamber body 102 coupled to a pumping volume 112 formed in a pumping plate 114. The pumping path 108 facilitates removal of gases from the internal volume 106.

The chamber 100 includes a gas distribution assembly 116 coupled to or disposed in the chamber lid 104 to deliver a flow of one or more gases into a processing region 110. The gas distribution assembly 116 includes a gas manifold 118 coupled to a gas inlet passage 120 formed in the chamber lid 104. The gas manifold 118 receives a flow of gases from one or more gas sources 122 (two are shown). The flow of gases received from the one or more gas sources 122 distributes across a gas box 124, flows through a plurality of openings of a backing plate 126, and further distributes across a plenum 128 defined by the backing plate 126 and a faceplate 130. The flow of gases then flows into a processing region 110 of the internal volume 106 through a plurality of openings 132 of the faceplate 130. A pump 133 is connected to the pumping path 108 by a conduit 134 to control the pressure within a processing region 110 and to the exhaust gases and byproducts from the processing region 110 through the pumping volume 112 and pumping path 108.

The internal volume 106 includes a pedestal 138 that supports a substrate 136 within the chamber 100. The pedestal 138 includes a heater 198 and an electrode 140 disposed within the pedestal 138. The electrode 140 may include a conductive mesh, such as a tungsten-containing, copper-containing, or molybdenum-containing conductive radio frequency (RF) mesh. The heater 198 may include any material used for heating, including an alternating current (AC) coil. FIG. 1 illustrates the heater 198 as disposed below the electrode 140. However, it is contemplated that the heater 198 may alternatively be disposed above the electrode 140.

The pedestal 138 is movably disposed in the internal volume 106 by a stem 142 coupled to a lift system. Movement of the pedestal 138 facilitates transfer of the substrate 136 to and from the internal volume 106 through a slit valve formed through the chamber body 102. The pedestal 138 may also be moved to different positions for processing, insertion, and/or removal of the substrate 136. The pedestal 138 may also have openings disposed therethrough, through which a plurality of lift pins 150 may be movably disposed. In the lowered position, the plurality of lift pins 150 are projected from the pedestal 138 by contacting a lift plate 152 coupled to a bottom 154 of the chamber body. Projection of the lift pins 150 places the substrate 136 in a spaced-apart relation from the pedestal 138 to facilitate the transfer of the substrate 136.

The pedestal 138 in the implementation shown in FIG. 1 includes a support surface 138a that is configured to support a substrate 136 thereon. The support surface 138a and/or the pedestal 138 may be heated. During processing the substrate 136 is disposed on the support surface 138a. The pedestal 138 also includes an edge ring 139 disposed on the support surface 138a around the substrate 136. During substrate processing, as gases flow into the processing region 110, the heater 198 heats the pedestal 138 and the support surface 138a. Also during substrate processing, the electrode 140 propagates radio frequency (RF) energy, alternating current (AC), or direct current (DC) to facilitate plasma generation in the processing region 110 and/or to facilitate chucking of the substrate 138 to the pedestal 138. The heat, gases, and energy from the electrode 140 facilitate deposition of a film onto the substrate 136 during substrate processing.

In the implementation shown, a radio frequency (RF) source 156 is coupled to the electrode 140 disposed within the pedestal 138 through a matching circuit 158. Although an RF source 156 is illustrated, the present disclosure contemplates that other power sources may be used, such as an alternating current (AC) power source or direct current (DC) power source. The matching circuit 158 is electrically coupled to the electrode 140 by a conductive rod 160. The matching circuit 158 is also electrically coupled to the heater 198. A power source 159 is configured to provide power to the heater 198. The power source 159 may provide AC power or DC power to the heater 198 to generate heat. The faceplate 130, which is grounded via coupling to the chamber body 102 and the electrode 140 facilitate formation of a capacitive plasma coupling. For example, the RF source 156 provides RF energy to the electrode 140 within the pedestal 138 to facilitate generation of a capacitive coupled plasma between the pedestal 138 and the faceplate 130 of the gas distribution assembly 116. The RF source 156 connects to ground 171. A second RF source 166 also is configured to provide RF energy to the chamber 100. The second RF source 166 is connected to ground 173. Although a second RF source 166 is illustrated, the present disclosure contemplates that other power sources may be used, such as an alternating current (AC) power source or direct current (DC) power source.

When RF power is supplied to the electrode 140, an electric field is generated between the faceplate 130 and the pedestal 138 such that atoms of gases present in the processing region 110 between the pedestal 138 and the faceplate 130 are ionized and release electrons. The ionized atoms accelerate to the pedestal 138 to facilitate film formation on the substrate 136. In one example, the processing region 110 is between the faceplate 130 on a first side of the processing region 110, and the support surface 138a and the edge ring 139 on a second side of the processing region 110.

Figure 2:
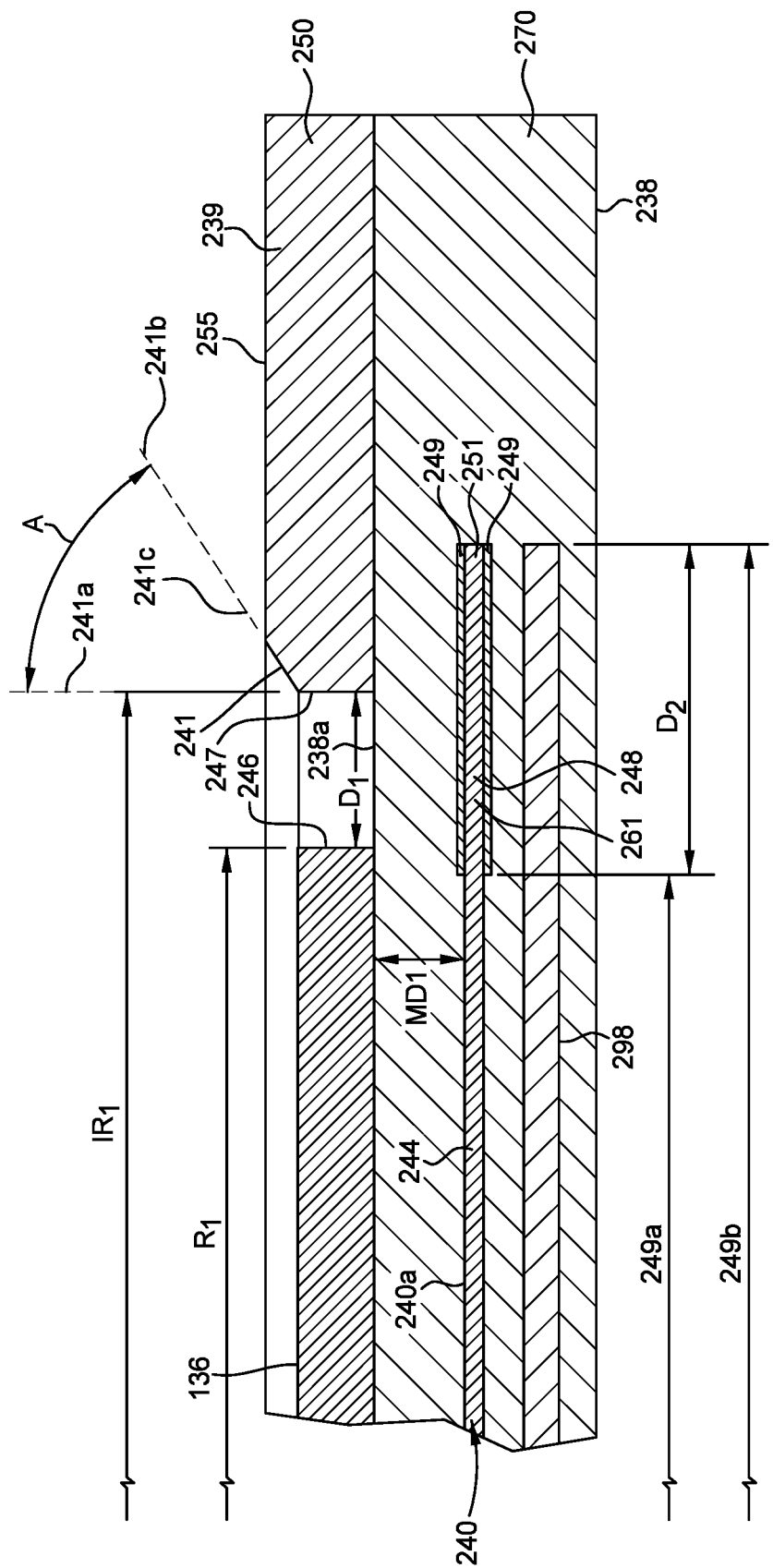
FIG. 2 is a schematic cross-sectional partial view of a portion of a pedestal that may be used in the chamber of FIG. 1, according to one implementation.

FIG. 2 is a schematic cross-sectional partial view of a portion of a pedestal 238 that may be used in the chamber 100 of FIG. 1, according to one implementation. The pedestal 238 includes a body 270 having a support surface 238a. The pedestal 238 includes an electrode 240 disposed in the body 270 of the pedestal 238. The support surface 238a and/or the pedestal 238 may be heated. The pedestal 238 also includes a heater 298 disposed therein. The heater 298 heats the pedestal 238 and/or the support surface 238a. The support surface 238a is configured to support a substrate 136 thereon, for example during processing of the substrate 136. As discussed above, the electrode 240 may include a conductive mesh for propagating RF energy. The heater 298 may include any material used for heating, including an alternating current (AC) coil. The heater 298 is disposed below the electrode 240. During processing, the substrate 136 is disposed on the support surface 238a of the pedestal 238. An outer edge 246 of the substrate 136 defines a radius $R_1$ of the substrate 136, measured from a center of the substrate 136. The pedestal 238 also includes an edge ring 239 that is disposed on the support surface 238a of the pedestal 238 and around the substrate 136. An inner surface 247 of the edge ring 239 defines an inner radius $IR_1$ of the edge ring 239. In one example, the inner radius $IR_1$ of the edge ring 239 is measured from a center of the edge ring 239. In one embodiment, which can be combined with other embodiments, the center of the support surface 238a is aligned with the center of the substrate 136 during processing of the substrate 136. In one embodiment, which can be combined with other embodiments, the center of the support surface 238a is aligned with the center of the edge ring 239. The edge ring 239 is concentric to the support surface 238a. In one embodiment, which can be combined with other embodiments, the inner radius $IR_1$ is within a range of 5.9 inches to 6.5 inches. In one embodiment, which can be combined with other embodiments, the radius $R_1$ is within a range of 5.9 inches to 6.0 inches.

The inner radius $IR_1$ of the edge ring 239 and the radius $R_1$ of the substrate 136 define a distance $D_1$ between the inner surface 247 of the edge ring 239 and the outer edge 246 of the substrate 136. The edge ring 239 is spaced from the substrate 136 by a gap. By using a certain distance $D_1$ between the edge ring 239 and the substrate 136, the amount of the support surface 238a between the substrate 136 and edge ring 239 that is exposed to processing gases can be controlled. Controlling the amount of the support surface 238a that is exposed may limit the capacitive discharge, or arcing, that might occur between the substrate 136 and edge ring 239 during substrate processing. Controlling the amount of support surface 238a that is exposed also promotes a thicker and more uniform film deposition on the substrate 136. In one embodiment, which can be combined with other embodiments, the distance $D_1$ is at least about 0.01 inches. In one example, the distance $D_1$ is within a range of about 0.02 inches to about 1.5 inches. In one example, the distance $D_1$ is within a range of 0.1 inches to 0.7 inches. In one example, the distance $D_1$ is about 0.3 inches.

The distance $D_1$ and the radius $R_1$ of the substrate 136 define a ratio RA of the distance $D_1$ to the radius $R_1$ of the substrate 136. In one embodiment, which can be combined with other embodiments, the ratio RA is within a range of about 0.00167 to about 0.210. In one example, the ratio RA is within a range of about 0.003 to about 0.2. In one example, the ratio RA is about 0.02.

The edge ring 239 illustrated in FIG. 2 includes a bevel 241 on an upper end of the inner surface 247 of the edge ring 239. The inner surface 247 is disposed radially inward of an outer surface 250 of the edge ring 239 relative to the center of the support surface 238a. The bevel 241 extends between the inner surface 247 and an upper surface 255 of the edge ring 239. The upper surface 255 of the edge ring 239 is disposed above a portion of the support surface 238a. The bevel 241 is defined at least partially by a sloped profile 241c that extends at an angle A. Angle A is measured between a first axis 241a that extends upward and orthogonally from the support surface 238a (e.g., parallel to a central axis of the edge ring 239) and a second axis 241b that extends along the sloped profile 241c of the bevel 241. By including a bevel, arcing may be reduced during substrate processing, and the loss of film deposition near the outer edge 246 of the substrate 136 may be reduced, thereby promoting a thicker and more uniform deposition of film onto the substrate 136. Additionally, by using a certain angle A of the bevel 241, arcing and film thickness loss can be reduced. Utilizing a bevel 241 on the edge ring 239 can also increase the die-per-substrate that may be obtained out of a given substrate 136 processed. In one embodiment, which can be combined with other embodiments, the angle A of the bevel 241 is within a range of about 0 degrees to about 90 degrees. In one example, the angle A of the bevel 241 is within a range of about 3 degrees to about 65 degrees. In one example, the angle A of the bevel 241 is within a range of about 10 degrees to about 60 degrees, such as about 10 degrees to about 30 degrees, about 30 degrees to about 60 degrees, about 20 degrees to about 50 degrees, or about 30 degrees to about 40 degrees. In one example, the angle A of the bevel 241 is about 15 degrees, for example within a range of 12 degrees to 18 degrees.

The electrode 240 shown in the implementation illustrated in FIG. 2 is disposed at a depth $MD_1$ below the support surface 238a and in the pedestal 238. The depth $MD_1$ is measured between the support surface 238a of the pedestal 238 and an upper end 240a of the electrode 240. In one example, the upper end 240a is an upper end of an RF mesh when the electrode 240 includes an RF mesh. The depth $MD_1$ may be selected to increase film deposition thickness during substrate processing while decreasing capacitive charge (e.g., arcing). Using a certain depth $MD_1$ of the electrode 240 can also increase throughput of the substrate processing chamber by limiting plasma coupling to the substrate 136. In one embodiment, which can be combined with other embodiments, the depth $MD_1$ of the electrode 240 is within a range of about 0.5 mm to about 4 mm. In one embodiment, which can be combined with other embodiments, the depth $MD_1$ of the electrode 240 is at least about 1.2 mm.

In the implementation illustrated in FIG. 2, at least a portion of the electrode 240 is coated with a coating 249. Such a coating 249 can reduce capacitive discharge between the substrate 136 and the edge ring 239 and reduce plasma coupling to the substrate 136. As discussed above, the electrode 240 may include an RF mesh. The coating 249 includes an inner radius 249a and an outer radius 249b. In one example, the electrode 240 is coated with a coating 249 to increase the overall volumetric electrical resistivity of the electrode 240. The electrode 240 is coated between the inner radius 249a and the outer radius 249b. In one example, the inner radius 249a of the coating 249 is about equal to the radius $R_1$ of the substrate 136. In one example, the coating 249 is disposed on a radially outward portion of the electrode 240, while radially inward portions of the electrode 240 are uncoated. The inner radius 249a of the coating 249 may also be greater than the radius $R_1$ of the substrate 136. In one example, the coating 249 has an inner radius 249a that is less than the radius $R_1$ of the substrate 136.

In one example, the outer radius 249b of the coating 249 is about equal to the inner radius $IR_1$ of the edge ring 239. In one example, the outer radius 249b of the coating 249 is greater than the inner radius $IR_1$ of the edge ring 239. The outer radius 249b of the coating 249 may also be lesser than the inner radius $IR_1$ of the edge ring 239. In one embodiment, which can be combined with other embodiments, a difference $D_2$ between the outer radius 249b of the coating 249 and the inner radius 249a of the coating 249 may be about equal to the distance $D_1$ between the inner surface 247 of the edge ring 239 and the outer edge 246 of the substrate 136. In one example, the difference $D_2$ is within a range of about 40 mm to about 80 mm. In the implementation illustrated in FIG. 2, the electrode 240 is coated with a coating 249 on a portion 248 of the electrode 240 that is aligned between the outer edge 246 of the substrate 136 and the inner surface 247 of the edge ring 239. The portion 248 is aligned radially inside of the inner surface 247 of the edge ring 239.

The electrode 240 is coated with a coating 249 on a portion 251 of the electrode 240 that is aligned underneath the edge ring 239. The portion 251 is aligned radially outside of the inner surface 247 of the edge ring 239. The electrode 240 is also coated with a coating 249 on a portion 261 of the electrode 240 that is aligned outside of the radius $R_1$ of the substrate 136. The coating 249 is disposed on the top and bottom of the electrode 240 (as shown in the implementation of FIG. 2), however, the coating 249 may alternatively be disposed on one of the top or bottom of the electrode 240. The coating 249 may be disposed on the entirety of the electrode 240, or it may be disposed on certain portions of the electrode 240.

In one embodiment, which can be combined with other embodiments, the inner radius 249a of the coating 249 is within a range of about 100 mm to about 140 mm. In one embodiment, which can be combined with other embodiments, the outer radius 249b of the coating 249 is within a range of about 140 mm to about 180 mm.

Coating of the electrode 240, as discussed in the examples above, may be performed by methods such as skin coating, surface chemistry modification, electroplating, etching, oxidizing, vacuum-based metal deposition, plastic coating, acid dipping, and/or other methods of increasing the volumetric electrical resistivity of a material. The coating 249 may be made from a composition including but not limited to materials such as refractory oxides and high temperature polymers. In one example, the coating 249 has a volumetric electrical resistivity that is greater than a volumetric electrical resistivity of the electrode 240. In one example, the volumetric electrical resistivity of the coating 249 is within a range of about 1.005 times to about 4.65 times greater than the volumetric electrical resistivity of the electrode 240. The present disclosure contemplates that a thickness of the coating 249 may be increased or decreased to increase or decrease, respectively, the overall volumetric electrical resistivity of the electrode 240.

In one embodiment, which can be combined with other embodiments, the pedestal 238 is made from one or more materials that enhance the volumetric electrical resistivity of the pedestal 238. By increasing the volumetric electrical resistivity of the pedestal 238, the path to ground 171 (shown in FIG. 1) from the support surface 238a involves a higher volumetric electrical resistivity, leading to less arcing between the substrate 136 and the edge ring 239. In one example, the pedestal 238 includes aluminum nitride and an impurity concentration of the pedestal 238 is changed to change the volumetric electrical resistivity of the pedestal 238 by an order of magnitude of 4.0 or more. A dopant may be used as an impurity to change the impurity concentration of the pedestal 238. In one example, the dopant includes magnesium. The pedestal 238 has a volumetric electrical resistivity that is within a range of about 1E6 Ohm-cm to about 1E12 Ohm-cm. In one example, the pedestal 238 has a volumetric electrical resistivity within a range of about 1E7 Ohm-cm to about 1E10 Ohm-cm. The pedestal 238 may have a dielectric constant of about 8 to about 10.

In one embodiment, which can be combined with other embodiments, the edge ring 239 is made from one or more materials that change the volumetric electrical resistivity of the edge ring 239 relative to a volumetric electrical resistivity of the pedestal 238. In one example, the edge ring 239 includes a material composition that is different than a material composition of the pedestal 238. Having heterogeneous volumetric electrical resistivity values between the edge ring 239 and the pedestal 238 reduces film edge non-uniformity by mitigating plasma sheath non-uniformity adjacent to the outer edge 246 of the substrate 136. Reducing plasma concentration near the outer edge 246 of the substrate 136 may reduce film deposition thickness loss near the outer edge 246 of the substrate. Reducing film deposition thickness loss near the outer edge 246 of the substrate 136 can result in a thicker and more uniform deposition of film on the substrate 136.

In one embodiment, which can be combined with other embodiments, the edge ring 239 has a volumetric electrical resistivity that is different from the volumetric electrical resistivity of the pedestal 238. In one example, the edge ring 239 has a volumetric electrical resistivity that is less than the volumetric electrical resistivity of the pedestal 238. In one example, the edge ring 239 has a volumetric electrical resistivity that is about half of the volumetric electrical resistivity of the pedestal 238. In one example, the edge ring 239 has a volumetric electrical resistivity that is about 1% (1 percent) of the volumetric electrical resistivity of the pedestal 238. In one example, the edge ring 239 has a volumetric electrical resistivity that is different from the volumetric electric resistivity of the pedestal 238 by a value that is within a range of about 9.9E7 Ohm-cm to about 9.999E11 Ohm-cm.

In one example, the edge ring 239 has a volumetric electrical resistivity that is within a range of about 1E6 Ohm-cm to about 1E12 Ohm-cm.

In one embodiment, which can be combined with other embodiments, the edge ring 239 has a volumetric electrical resistivity that is greater than the volumetric electrical resistivity of the pedestal 238. In one example, the edge ring 239 has a volumetric electrical resistivity that is about 10,000 times greater than the volumetric electrical resistivity of the pedestal 238.

Figure 3:
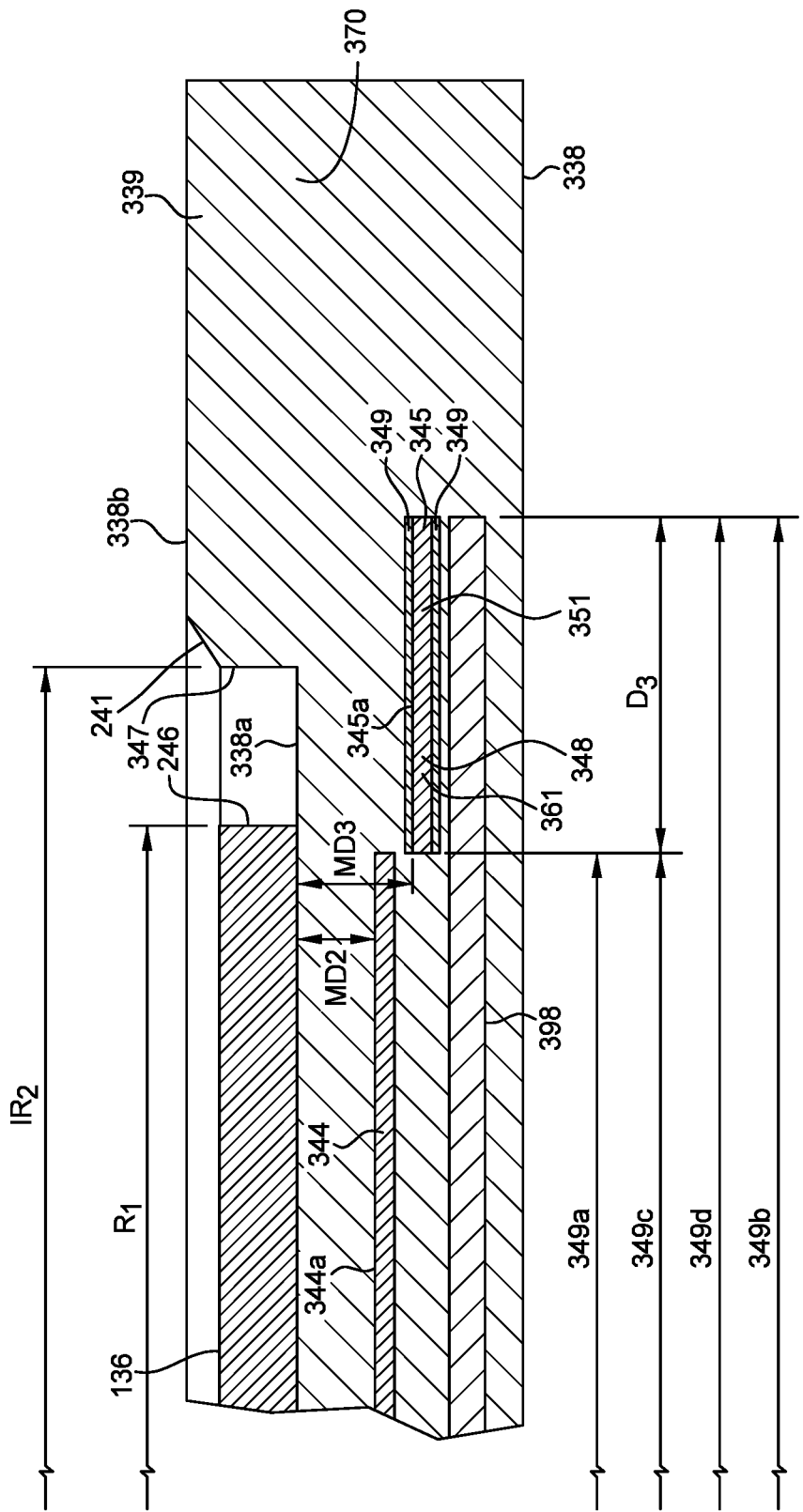
FIG. 3 is a schematic cross-sectional partial view of a portion of a pedestal that may be used in the chamber of FIG. 1, according to one implementation.

In one example, the edge ring 239 is bonded to the pedestal 238 to form a single body (as discussed in reference to FIG. 3). In one example, the edge ring 239 is bonded to the pedestal 238 using a ceramic-to-ceramic bond.

FIG. 3 is a schematic cross-sectional partial view of a portion of a pedestal 338 that may be used in the substrate processing chamber 100 of FIG. 1, according to one implementation. The pedestal 338 includes a support surface 338a that is configured to support a substrate 136 thereon, for example during processing of the substrate 136. The pedestal 338 and/or the support surface 338a may be heated. The pedestal 338 also includes a stepped surface 338b that protrudes upwards from the support surface 338a. The stepped surface 338b is disposed about the support surface 338a and radially outside of the support surface 338a to surround the support surface 338a. The stepped surface 338b defines an edge ring 339 that is disposed around the substrate 136. In one embodiment, which can be combined with other embodiments, the edge ring 339 is integrated (e.g., is a unitary piece of material) with a body of the pedestal 338. In one embodiment, which can be combined with other embodiments, the edge ring 339 is part of the pedestal 338 such that the edge ring 339 and the pedestal 338 form a body 370 that is monolithic. In one example, the edge ring 339 and the pedestal 338 form the body 370 such that the edge ring 339 is a first portion of the body 370 and the pedestal 338 is a second portion of the body 370. In one example, the edge ring 339 is bonded to the pedestal 338 to form the body 370. The edge ring 339 may be bonded to the pedestal 338 using a ceramic-to-ceramic bond. In one example, a ceramic block is machined to form the body 370 having the edge ring 339 and the pedestal 338. The body 370 may include a material gradient or impurity gradient such that the edge ring 339 includes a material composition different than a material composition of the body 370. A dopant may be used as an impurity to establish the impurity gradient. In one example, the dopant includes magnesium. The body 370 may include a material gradient or impurity gradient such that the edge ring 339 includes a volumetric electrical resistivity different than a volumetric electrical resistivity of the body 370.

By integrating the edge ring 339 and the pedestal 338, or by forming the monolithic body 370 with the pedestal 338 and the edge ring 339, the edge ring 339 is less prone to damage and installation error, leading to less cost and higher throughput of the chamber 100 during substrate processing operations. Such a configuration also results in less chipping of the edge ring 339, which in turn results in less arcing between the substrate 136 and the edge ring 339. The electric potential on the stepped surface 338b is also closer to the electric potential on the support surface 338a, which results in less arcing between the substrate 136 and the edge ring 339.

FIG. 3 illustrates an edge ring 339 (defined by a stepped surface 338b) that includes an inner surface 347 extending upward from the support surface 338a. The bevel 241 is disposed at an upper end of the inner surface 347. The bevel 241 extends between the inner surface 347 and the stepped surface 338b. The inner surface 347 defines an inner radius $IR_2$ of the edge ring 339. The substrate 136 shown includes the outer edge 246 that defines the radius $R_1$ measured from the center of the substrate 136. The pedestal 338 includes a heater 398, which may be made from any heating material, and may be formed into, for example, an AC coil. The heater 398 may heat the pedestal 338 and/or the support surface 338a. A first electrode 345 and a second electrode 344 are disposed in the pedestal 338. The heater 398 is disposed below the first electrode 345 and the second electrode 344.

The first electrode 345 and the second electrode 344 may include a conductive mesh for propagating RF energy. In the implementation illustrated in FIG. 3, the first electrode 345 is disposed in the pedestal 338 at a first depth $MD_3$. The first depth $MD_3$ is measured between the support surface 338a and an upper end 345a of the first electrode 345. The second electrode 344 is disposed in the pedestal 338 at a second depth $MD_2$. The second depth $MD_2$ is measured between the support surface 338a and an upper end 344a of the second electrode 344.

In one embodiment, which can be combined with other embodiments, the first electrode 345 is disposed at a first depth $MD_3$ that is greater than the second depth $MD_2$ at which the second electrode 344 is disposed. In one example, the first electrode 345 is disposed at a first depth $MD_3$ that is at least about 1.5 times greater than the second depth $MD_2$ of the second electrode 344. In one example, the first electrode 345 is disposed at a first depth $MD_3$ that is about 1 mm larger than the second depth $MD_2$ of the second electrode 344. In one embodiment, which can be combined with other embodiments, the first depth $MD_3$ is about equal to the second depth $MD_2$. In one embodiment, which can be combined with other embodiments, the first depth $MD_3$ is within a range of about 1.25 mm to about 7 mm. In one example, the first depth $MD_3$ is within a range of about 1.4 mm to about 5 mm. In one example, the first depth $MD_3$ is about 3 mm. The first electrode 345 is disposed radially outside of the second electrode 344.

The first electrode 345 includes an inner radius 349a and an outer radius 349b. The first electrode 345 is coated at least partially with a coating 349. Such a coating 349 can reduce capacitive discharge between the substrate 136 and the edge ring 339 and reduce plasma coupling to the substrate 136. In one example, the coating 349 increases the overall volumetric electrical resistivity of the first electrode 345. The first electrode 345 is coated with the coating 349 between the inner radius 349a and the outer radius 349b of the first electrode 345. In one example, the inner radius 349a of the first electrode 345 is about equal to the radius $R_1$ of the substrate 136. In one example, the inner radius 349a of the first electrode 345 is greater than the radius $R_1$ of the substrate 136. In one example, the inner radius 349a of the first electrode 345 is less than the radius $R_1$ of the substrate 136.

In one example, the outer radius 349b of the first electrode 345 is greater than the inner radius $IR_2$ of the edge ring 339. In one example, the outer radius 349b of the first electrode 345 is lesser than the inner radius $IR_2$ of the edge ring 339. In one embodiment, which can be combined with other embodiments, the outer radius 349b of the first electrode 345 is about equal to the inner radius $IR_2$ of the edge ring 339.

The coating 349 includes an inner radius 349c and an outer radius 349d. In one example, the inner radius 349c of the coating 349 is within a range of about 100 mm to about 140 mm. In one example, the outer radius 349d of the coating 349 is within a range of about 140 mm to about 180 mm.

In one example, the inner radius 349c of the coating 349 is about equal to the radius $R_1$ of the substrate 136. In one example, the inner radius 349c of the coating 349 is lesser than the radius $R_1$ of the substrate 136. In one example, the inner radius 349c of the coating 349 is greater than the radius $R_1$ of the substrate 136.

In one example, the outer radius 349d of the coating 349 is about equal to the inner radius $IR_2$ of the edge ring 339. In one example, the outer radius 349d of the coating 349 is greater than the inner radius $IR_2$ of the edge ring 339. In one example, the outer radius 349d of the coating 349 is lesser than the inner radius $IR_2$ of the edge ring 339.

In one embodiment, which can be combined with other embodiments, a difference $D_3$ between the outer radius 349d of the coating 349 and the inner radius 349c of the coating 349 is within a range of about 40 mm to about 80 mm. In one embodiment, which can be combined with other embodiments, the coating 349 is disposed on the first electrode 345 between the inner radius 349a and the outer radius 349b.

In one example, the first electrode 345 is coated with the coating 349 on a portion 351 of the first electrode 345 that is aligned underneath the edge ring 339. In one example, the first electrode 345 is coated with the coating 349 on a portion 361 of the first electrode 345 that is aligned outside of the radius $R_1$ of the substrate 136. The coating 349 may be disposed on the top and bottom of the first electrode 345 (as shown in the implementation of FIG. 3), or the coating 349 may be disposed on one of the top or bottom of the first electrode 345. In one example, the first electrode 345 is coated with a coating 349 on a portion 348 of the first electrode 345 that is aligned between the edge ring 339 and the substrate 136.

The second electrode 344 may also be coated with a coating to increase the overall volumetric electrical resistivity of the second electrode 344.

Coating of the first electrode 345 and/or the second electrode 344, as discussed in the examples above, may be performed by methods such as skin coating, surface chemistry modification, electroplating, etching, oxidizing, vacuum-based metal deposition, plastic coating, acid dipping, and/or other methods of increasing the volumetric electrical resistivity of a material. In one embodiment, which can be combined with other embodiments, the coating 349 has a volumetric electrical resistivity that is greater than a volumetric electrical resistivity of the first electrode 345. In one example, the volumetric electrical resistivity of the coating 349 is within a range of about 1.005 times to about 4.65 times greater than the volumetric electrical resistivity of the first electrode 345. The present disclosure contemplates that a thickness of the coating 349 may be increased or decreased to increase or decrease, respectively, the overall volumetric electrical resistivity of the first electrode 345.

One or more of the above aspects may be expressed in the following examples.

Example 1 includes a method of operating a substrate processing chamber. The method includes disposing an edge ring on a pedestal disposed in an internal volume of a chamber body. The method also includes disposing a substrate on a support surface of the pedestal and radially inside of the edge ring. The substrate is disposed at a distance from the edge ring.

Example 2 includes the method of Example 1, and the distance is measured between an outer edge of the substrate and an inner surface of the edge ring.

Example 3 includes the method of Example 2, and the distance is at least 0.01 inches.

Example 4 includes the method of Example 2, and the substrate includes a radius measured between the outer edge and a center of the substrate. The method also includes a ratio of the distance to the radius, the ratio being within a range of 0.00167 to 0.210.

Benefits of the present disclosure include reduced arcing, reduced or limited plasma coupling to substrates, uniform film deposition, thick film deposition, less edge thickness loss, enhanced throughput, and lower operational costs. Aspects of the present disclosure include an edge ring that is integrated with a pedestal; an edge ring disposed at various distances from a substrate; an edge ring with a bevel; an edge ring that has a different volumetric electrical resistivity than a volumetric electrical resistivity of the pedestal; an edge ring made from a different material than a material of the pedestal; a pedestal having an electrode with a coating disposed thereon; and a pedestal having electrodes disposed at various depths therein. It is contemplated that one or more aspects of the various edge ring examples and/or one or more aspects of the various pedestal examples disclosed herein may be combined. Moreover, it is contemplated that the one or more aspects of the various edge ring examples and/or one or more aspects of the various pedestal examples may include some or all of the aforementioned benefits.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. For example, one or more aspects of embodiments described for edge ring 339 may be substituted in for, or combined with, one or more aspects of embodiments described for edge ring 239 and/or one or more aspects of embodiments described for edge ring 139. The scope of the disclosure is determined by the claims that follow.

What is claimed is:

1. A pedestal for disposition in a substrate processing chamber, comprising:
    a body, the body comprising a support surface, a stepped surface that protrudes upwards from the support surface, and an innermost surface extending upwards from the support surface, the stepped surface being disposed about the support surface to surround the support surface, and the stepped surface defining an edge ring such that the edge ring is integrated with the pedestal to form the body that is monolithic;
    an electrode disposed in the body at a depth below the support surface; an uncoated center portion of the electrode contacting the body;
    one or more heaters disposed in the body; and
    a coating composed of a different material than the body coated on at least part of the electrode and disposed radially outward of the uncoated center portion of the electrode, the coating having a volumetric electrical resistivity that is greater than a volumetric electrical resistivity of the electrode, the coating disposed on a first surface of the electrode and a second surface opposite the first surface, and the coating having:
        an inner radius aligned radially outward of a center of the body and inward of the innermost surface, and
        an outer radius aligned radially outwardly of the innermost surface.

2. The pedestal of claim 1, wherein the edge ring is a first portion of the body and a second portion of the body includes the support surface.

3. The pedestal of claim 2, wherein the first portion having the edge ring has a volumetric electrical resistivity that is different than a volumetric electrical resistivity of the second portion having the support surface.

4. The pedestal of claim 3, wherein the volumetric electrical resistivity of the first portion having the edge ring is less than the volumetric electrical resistivity of the second portion having the support surface.

5. The pedestal of claim 2, wherein the first portion having the edge ring comprises a bevel on an upper end of the innermost surface, the bevel extending between the innermost surface and the stepped surface.

6. The pedestal of claim 1, wherein the coating is formed of one or more of a refractory oxide or a polymer.

7. The pedestal of claim 1, wherein the inner radius of the coating is about 100 mm to about 140 mm.

8. A pedestal for disposition in a substrate processing chamber, comprising:
    a body comprising a support surface, the support surface comprising an inner region configured to support a substrate and an outer region to configured to support an edge ring, the outer region disposed outwardly of the inner region;
    a first electrode disposed in the body at a first depth below the support surface, an uncoated center portion of the first electrode contacting the body; and
    a coating composed of a different material than the body coated on at least part of the first electrode and disposed radially outward of an uncoated center portion of the electrode, the coating having a volumetric electrical resistivity that is greater than a volumetric electrical resistivity of the first electrode, the coating disposed on a first surface of the electrode and a second surface opposite the first surface, and the coating having:
        an inner radius aligned radially outward of a center of the body and inward of the outer region of the support surface, and
        an outer radius aligned under the outer region of the support surface.

9. The pedestal of claim 8, wherein the first depth is within a range of 0.5 mm to 4 mm.

10. The pedestal of claim 8, wherein the first depth is at least 1.2 mm.

11. The pedestal of claim 8, wherein the coating is coated on at least part of the first electrode using one or more of skin coating, surface chemistry modification, electroplating, etching, oxidizing, vacuum-based metal deposition, plastic coating, and/or acid dipping.

12. The pedestal of claim 8, wherein the coating is coated onto a portion of the first electrode that is aligned radially inside of the outer region of the support surface.

13. The pedestal of claim 12, wherein the coating is coated onto a portion of the first electrode that is aligned under the outer region of the support surface.

14. The pedestal of claim 12, further comprising a second electrode disposed in the body at a second depth below the support surface, the first depth being greater than the second depth.

15. A substrate processing chamber, comprising:
    a chamber body comprising an internal volume;
    a pedestal disposed in the internal volume, the pedestal comprising a support surface, an electrode disposed at a depth below the support surface, an uncoated center portion of the electrode contacting the body, and a coating composed of a different material than the body coated on at least part of the electrode and disposed radially outward of an uncoated center portion of the electrode, the coating having a volumetric electrical resistivity that is greater than a volumetric electrical resistivity of the electrode, the coating disposed on a first surface of the electrode and a second surface opposite the first surface, and the coating having an inner radius and an outer radius; and
    an edge ring, the edge ring comprising an innermost surface, an outer surface, an upper surface, and a bevel on an upper end of the innermost surface, the bevel extending between the innermost surface and the upper surface, the inner radius of the coating aligned radially outward of a center of the pedestal and inward of the innermost surface of the edge ring, and the outer radius of the coating aligned radially outwardly of the innermost surface.

16. The pedestal of claim 15, wherein the first portion having the edge ring comprises a first material, and the second portion having the support surface comprises a second material that is different than the first material.

17. The substrate processing chamber of claim 15, wherein the bevel includes a sloped profile that extends at an angle between the innermost surface and the upper surface of the edge ring, and the angle is measured between a first axis that extends upward and orthogonally from the support surface and a second axis that extends along the sloped profile of the bevel.

18. The substrate processing chamber of claim 17, wherein the angle is within a range of 10 degrees to 90 degrees.

19. The substrate processing chamber of claim 18, wherein the angle is within a range of 12 degrees to 18 degrees.

20. The substrate processing chamber of claim 18, wherein the edge ring is integrated with the pedestal to form a body that is monolithic, the upper surface of the edge ring being disposed about the support surface to surround the support surface.

21. The substrate processing chamber of claim 15, wherein a volumetric electrical resistivity of the edge ring is less than a volumetric electrical resistivity of the pedestal.

* * * * *